(12) United States Patent
Sekimoto

(10) Patent No.: US 10,111,325 B2
(45) Date of Patent: Oct. 23, 2018

(54) ELASTIC CONDUCTOR

(71) Applicant: Murata Manufacturing Co., Ltd., Nagaokakyo-shi, Kyoto-fu (JP)

(72) Inventor: Yasuyuki Sekimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/893,737

(22) Filed: Feb. 12, 2018

(65) Prior Publication Data

US 2018/0168028 A1    Jun. 14, 2018

Related U.S. Application Data

(63) Continuation of application No. PCT/JP2016/071972, filed on Jul. 27, 2016.

(30) Foreign Application Priority Data

Aug. 20, 2015    (JP) .................. 2015-162721

(51) Int. Cl.
*H05K 1/02* (2006.01)
*H05K 1/18* (2006.01)
(Continued)

(52) U.S. Cl.
CPC ............... *H05K 1/028* (2013.01); *H01B 7/06* (2013.01); *H01B 7/08* (2013.01); *H05K 1/18* (2013.01);
(Continued)

(58) Field of Classification Search
CPC ........ H05K 1/028; H05K 1/18; H05K 1/0213; H05K 1/0215; H05K 1/0216;
(Continued)

(56) References Cited

U.S. PATENT DOCUMENTS 7,491,892 B2    2/2009  Wagner et al.
2013/0214214 A1    8/2013  Carnahan et al.
(Continued)

FOREIGN PATENT DOCUMENTS

JP    2005-259609 A    9/2005
JP    2005-322492 A    11/2005
(Continued)

OTHER PUBLICATIONS

Official Communication issued in International Patent Application No. PCT/JP2016/071972, dated Oct. 11, 2016.

*Primary Examiner* — Jeremy C Norris

(74) *Attorney, Agent, or Firm* — Keating & Bennett, LLP

(57) ABSTRACT

An elastic conductor includes a stretchable base, and conductors each having a longitudinal shape, being arranged on a surface of the stretchable base, and having a lower specific resistance and a higher modulus of elasticity than the stretchable base. In the first state, the conductors are spaced apart from each other in the second direction perpendicular or substantially perpendicular to the first direction, and are continuous in a section extending in the first direction as seen in the second direction from one end of the section to the other end of the section, in which a distance between the conductors adjacent to each other in the second direction in the second state is shorter than a distance between the conductors adjacent to each other in the second direction in the first state.

19 Claims, 29 Drawing Sheets

(51) Int. Cl.
*H01B 7/06* (2006.01)
*H01B 7/08* (2006.01)
H01B 1/24 (2006.01)
H01B 1/02 (2006.01)
H01B 1/22 (2006.01)

(52) U.S. Cl.
CPC ................ *H01B 1/02* (2013.01); *H01B 1/023* (2013.01); *H01B 1/026* (2013.01); *H01B 1/22* (2013.01); *H01B 1/24* (2013.01); *H05K 2201/0129* (2013.01)

(58) Field of Classification Search
CPC .... H05K 1/0218; H05K 1/0228; H05K 1/023; H05K 1/0236; H05K 1/0237; H05K 1/0254; H05K 1/0263
See application file for complete search history.

(56) References Cited

U.S. PATENT DOCUMENTS

2015/0129276 A1    5/2015   Shumaker et al.
2016/0211473 A1    7/2016   Van Den Ende et al.

FOREIGN PATENT DOCUMENTS

| | | |
|---|---|---|
| JP | 2008-058286 A | 3/2008 |
| JP | 2011-070821 A | 4/2011 |
| WO | 2015/034358 A1 | 3/2015 |

ELASTIC CONDUCTOR

CROSS REFERENCE TO RELATED APPLICATIONS

This application claims the benefit of priority to Japanese Patent Application No. 2015-162721 filed on Aug. 20, 2015 and is a Continuation Application of PCT Application No. PCT/JP2016/071972 filed on Jul. 27, 2016. The entire contents of each application are hereby incorporated herein by reference.

BACKGROUND OF THE INVENTION

1. Field of the Invention

The present invention relates to an elastic conductor that is changeable between a first state before tensile force acts in a first direction and a second state in which the tensile force acts in the first direction to cause the elastic conductor to be expanded in the first direction.

2. Description of the Related Art

Japanese Patent Laying-Open No. 2005-322492 discloses an elastic conductor configured to be stretchable. In the elastic conductor disclosed in Japanese Patent Laying-Open No. 2005-322492, particulate or fibrous magnetic conductors are kneaded into a rubber-like elastic body. Then, in the state in which the magnetic conductors are oriented in a prescribed first direction by a magnetic field, some of the magnetic conductors are branched in the second direction that crosses the first direction.

With the configuration as described above, the magnetic conductors branched in the second direction are able to form a connection between the magnetic conductors oriented in the first direction. Thus, the electrical resistance is able to be lowered while excellent conduction is achieved.

According to the configuration disclosed in Japanese Patent Laying-Open No. 2005-322492, however, when the elastic conductor is expanded to a considerable degree in the first direction in which the metal particles are oriented, the connection between the particulate or fibrous magnetic conductors oriented in the first direction is disconnected. This leads to a fear that the electrical resistance of the elastic conductor may increase.

SUMMARY OF THE INVENTION

Preferred embodiments of the present invention provide elastic conductors capable of reducing or preventing an increase in electrical resistance caused by an increase in path length when the elastic conductor is expanded in a prescribed direction.

An elastic conductor according to a preferred embodiment of the present invention is changeable between a first state before tensile force acts in a first direction and a second state in which the tensile force acts in the first direction to cause the elastic conductor to be expanded in the first direction. The elastic conductor includes a stretchable base having conductivity; and a plurality of conductors each having a longitudinal shape extending in the first direction and arranged on a surface of the stretchable base or inside the stretchable base, each of the plurality of conductors having a lower specific resistance and a higher modulus of elasticity than the stretchable base. In the first state, the plurality of conductors are spaced apart from each other in a second direction perpendicular or substantially perpendicular to the first direction, and to be continuous in at least a partial section extending in the first direction as seen in the second direction from one end of the partial section to the other end of the partial section in the first direction, in which a distance between conductors adjacent to each other in the second direction in the second state is shorter than a distance between conductors adjacent to each other in the second direction in the first state.

In an elastic conductor according to a preferred embodiment the present invention, it is preferable that each of the plurality of conductors is made of a metal material in a bulk state or metal foil. In this case, the metal material in a bulk state means a massive metal material made of hardened metal, and does not include a metal material formed by drying a binder including a large amount of metal particles, such as a paste material.

An elastic conductor according to a preferred embodiment of the present invention may further include a restraint member that has a higher modulus of elasticity than the stretchable base, the restraint member being structured to reduce or prevent expansion and contraction of the stretchable base in the second direction. In this case, in the at least a partial section, two or more conductors of the plurality of conductors are arranged side by side in the second direction, to define a dense region in which the conductors along a width of the stretchable base in the second direction are dense in number; and a sparse region in which the conductors along the width of the stretchable base in the second direction are less dense in number than the dense region. Furthermore, it is preferable that the restraint member is provided on a back surface of the stretchable base or inside the stretchable base so as to overlap with the sparse region as seen in a direction perpendicular or substantially perpendicular to the surface of the stretchable base.

An elastic conductor according to a preferred embodiment of the present invention may further include a restraint member that has a higher modulus of elasticity than the stretchable base, the restraint member being structured to reduce or prevent expansion and contraction of the stretchable base in the second direction. In this case, an electronic component mounted region including an electronic component mounted thereon may be provided on the surface of the stretchable base, the surface being adjacent to the at least a partial section. Furthermore, it is preferable that the restraint member is provided on a back surface of the stretchable base so as to overlap with the electronic component mounted region as seen in a perpendicular or substantially perpendicular direction to the surface of the stretchable base.

An elastic conductor according to a preferred embodiment of the present invention may further include an elastic base including a first main surface and a second main surface that face in opposite directions, the elastic base being structured to support the stretchable base and the plurality of conductors. In this case, it is preferable that the plurality of conductors are provided on the first main surface, and it is also preferable that the stretchable base is provided on the first main surface to cover the plurality of conductors.

An elastic conductor according to a preferred embodiment of the present invention may further include a restraint member that has a higher modulus of elasticity than the elastic base, the restraint member being structured to significantly reduce or prevent expansion and contraction of the elastic base in the second direction. In this case, it is preferable that, in the at least a partial section, two or more conductors of the plurality of conductors are arranged side by side in the second direction, to define a dense region in which the conductors along a width of the stretchable base in the second direction are dense in number; and a sparse region in which the conductors along the width of the stretchable base in the second direction are less dense in number than the dense region. Furthermore, it is preferable that the restraint member is provided on the second main surface so as to overlap with the sparse region as seen in a perpendicular or substantially perpendicular direction to the second main surface.

An elastic conductor according to a preferred embodiment the present invention may further include a restraint member that has a higher modulus of elasticity than the elastic base, the restraint member being structured to reduce or prevent expansion of the elastic base in the second direction. In this case, it is preferable that an electronic component mounted region including an electronic component mounted thereon is provided on the surface of the stretchable base, the surface being adjacent to the at least a partial section. Furthermore, it is preferable that the restraint member is provided on the second main surface so as to overlap with the electronic component mounted region as seen in a perpendicular or substantially perpendicular direction to the second main surface.

According to preferred embodiments of the present invention, it is possible to provide elastic conductors capable of reducing or preventing an increase in electrical resistance caused by an increase in path length when the elastic conductor is expanded in a prescribed direction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
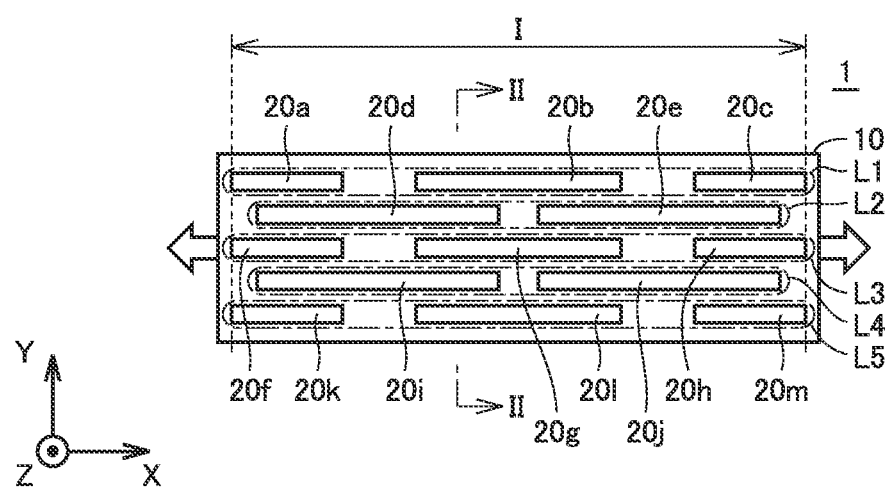
FIG. 1 is a plan view of an elastic conductor according to a first preferred embodiment of the present invention.

Preferred embodiments of the present invention will be described in detail with reference to the accompanying drawings. In the preferred embodiments described herein, the same or corresponding components are designated by the same reference characters, and description thereof will not be repeated.

First Preferred Embodiment

Figure 2:
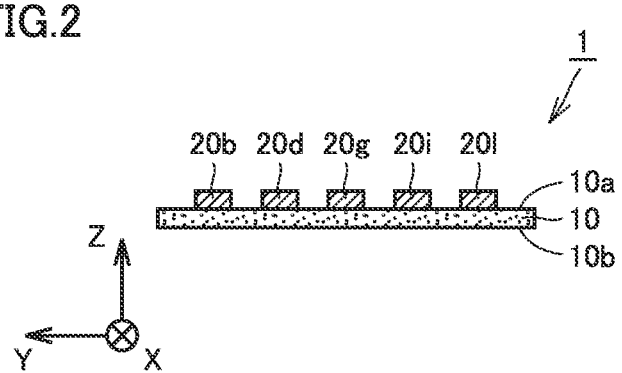
FIG. 2 is a cross-sectional view taken along a line II-II shown in FIG. 1.
Figure 3:
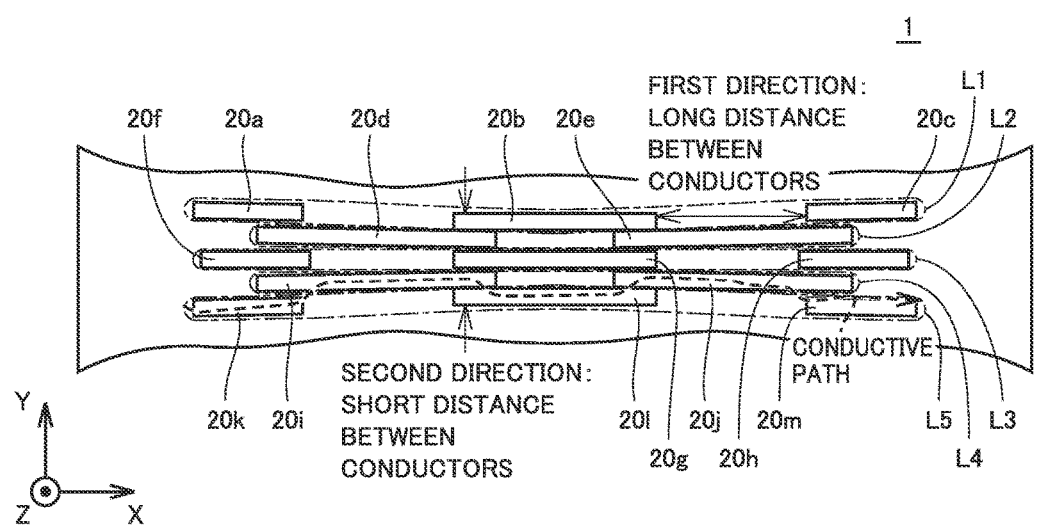
FIG. 3 is a diagram showing a state in which the elastic conductor according to the first preferred embodiment of the present invention is tensioned in the first direction.

FIG. 1 is a plan view of an elastic conductor according to a first preferred embodiment of the present invention. FIG. 2 is a cross-sectional view taken along a line II-II in FIG. 1. FIG. 3 is a diagram showing a state in which the elastic conductor according to the first preferred embodiment is tensioned in the first direction. Referring to FIGS. 1 to 3, an elastic conductor 1 according to the present preferred embodiment will be hereinafter described.

As shown in FIGS. 1 to 3, elastic conductor 1 according to the present preferred embodiment is structured to be changeable between a first state before tensile force acts in a first direction; and a second state in which the tensile force acts in the first direction to cause elastic conductor 1 to be expanded in the first direction. FIGS. 1 and 2 each show the first state of elastic conductor 1, and FIG. 3 shows the second state of elastic conductor 1.

As shown in FIGS. 1 and 2, elastic conductor 1 includes a stretchable base 10 having conductivity and a plurality of conductors 20a to 20m. Stretchable base 10 is stretchable.

Stretchable base 10 preferably has a rectangular or substantially rectangular shape, for example. Specifically, stretchable base 10 preferably has a rectangular or substantially rectangular shape in plan view, for example, in which an X-axis direction corresponding to the first direction is defined as a long side direction while a Y-axis direction corresponding to the second direction orthogonal or substantially orthogonal to the first direction is defined as a short side direction. In addition, the Z-axis direction corresponds to the thickness direction of stretchable base 10.

Stretchable base 10 may be made using a material obtained by kneading a rubber material or resin with conductive powder (such as spherical powder, fibrous powder, or flake-shaped powder). Specifically, stretchable base 10 may preferably be made using a material obtained by adding a carbon filler to a thermoplastic elastomer, such as styrene ethylene butylene styrene copolymer (SEBS), for example. Examples of a rubber material may be nitrile rubber (NBR), chloroprene rubber (CR), ethylene propylene rubber (EPDM), silicone rubber, isobutylene-isoprene rubber (IIR), styrene rubber (SBR), urethane rubber, Hypalon (CSM), fluoro-rubber (FKM), and other suitable materials. Furthermore, it is preferable to use a rubber material having one or more of characteristics including: 1) modulus of elasticity of about several MPa; 2) heat resistance equal to or higher than about 100° C., preferably, equal to or higher than about 150° C. to about 200° C.; 3) shape restorability; 4) bioaffinity; and 5) moisture permeability. As a conductive powder, in addition to a carbon filler, metal such as Ag, Cu, Al, Zn, Ni, and Sn or an alloy made of two or more of these metals may be added.

The plurality of conductors 20a to 20m each preferably have a longitudinal shape extending in the first direction. The plurality of conductors 20a to 20m are arranged on a surface 10a of the stretchable base. The plurality of conductors 20a to 20m have a lower specific resistance and a higher modulus of elasticity than stretchable base 10.

Each of the plurality of conductors 20a to 20m is preferably made, for example, of metal foil. For example, copper foil may be used as metal foil. The plurality of conductors 20a to 20m are formed by a subtractive method, such as a printing method, a photolithography method, and a direct imaging method, for example.

The plurality of conductors 20a to 20m are spaced apart from each other in the second direction perpendicular or substantially perpendicular to the first direction, and to be continuous in at least a partial section I extending in the first direction as seen in the second direction from one end of partial section I to the other end of partial section I in the first direction.

The plurality of conductors 20a to 20m are arranged in a staggered manner. Some conductors of the plurality of conductors 20a to 20m are linearly arranged so as to be spaced apart from each other in the first direction, with the result that a first line L1 to a fifth line L5 are provided. First line L1 to fifth line L5 are sequentially arranged so as to be spaced apart from each other in the Y-axis direction. Third line L3 is located in the center or approximate center portion of stretchable base 10 in the second direction.

First line L1, third line L3, and fifth line L5 preferably have the same or substantially the same configuration. First line L1 includes conductors 20a, 20b and 20c. Conductors 20a, 20b and 20c are linearly arranged to be spaced apart from each other in the first direction. Third line L3 includes conductors 20f, 20g and 20h. Conductors 20f, 20g and 20h are linearly arranged to be spaced apart from each other in the first direction. Fifth line L5 includes conductors 20k, 20l and 20m. Conductors 20k, 20l and 20m are linearly arranged to be spaced apart from each other in the first direction.

Conductors 20a, 20f and 20k are located on the one end side of section I. Conductors 20a, 20f and 20k preferably have the same or substantially the same length. First ends of conductors 20a, 20f and 20k in the first direction overlap with one another as seen in the second direction. Second ends of conductors 20a, 20f and 20k in the first direction overlap with one another as seen in the second direction. Conductors 20a, 20f and 20k are spaced apart from each other in the second direction.

Conductors 20c, 20h and 20m are located on the other end side of section I. Conductors 20c, 20h and 20m preferably have the same or substantially the same length. First ends of conductors 20c, 20h and 20m in the first direction overlap with one another as seen in the second direction. Second ends of conductors 20c, 20h and 20m in the first direction overlap with one another as seen in the second direction. Conductors 20c, 20h and 20m are spaced apart from each other in the second direction.

Conductors 20b, 20g and 20l are located between conductors 20a, 20f and 20k and conductors 20c, 20h and 20m in the first direction. Conductors 20b, 20g and 20l preferably have the same or substantially the same length. First ends of conductors 20b, 20g and 20l in the first direction overlap with one another as seen in the second direction. Second ends of conductors 20b, 20g and 20l in the first direction overlap with one another as seen in the second direction. Conductors 20b, 20g and 20l are spaced apart from each other in the second direction.

Second line L2 and fourth line L4 preferably have the same or substantially the same configuration. Second line L2 includes conductors 20d and 20e. Second line L2 is located between first line L1 and third line L3 in the second direction. Fourth line L4 is located between third line L3 and fifth line L5 in the second direction.

Conductors 20d and 20e are linearly arranged to be spaced apart from each other in the first direction. The first end side of conductor 20d in the first direction is located between conductors 20a and 20f in the second direction. A first end of conductor 20d in the first direction is located more inward than first ends of conductors 20a and 20f in the first direction. In other words, a first end of conductor 20d in the first direction is located closer to the second ends of conductors 20a and 20f in the first direction than first ends of conductors 20a and 20f in the first direction.

The second end side of conductor 20d in the first direction is located between conductors 20b and 20g in the second direction. The second end of conductor 20d in the first direction is located closer to first ends of conductors 20b and 20g in the first direction than the center or approximate center portions of conductors 20b and 20g.

The first end side of conductor 20*e* in the first direction is located between conductors 20*b* and 20*g* in the second direction. The first end of conductor 20*e* in the first direction is located closer to the second ends of conductors 20*b* and 20*g* in the first direction than the center or approximate center portions of conductors 20*b* and 20*g*.

The second end side of conductor 20*e* in the first direction is located between conductors 20*c* and 20*h* in the second direction. The second end of conductor 20*e* in the first direction is located more inward than the second ends of conductors 20*c* and 20*h* in the first direction. In other words, the second end of conductor 20*e* in the first direction is located closer to first ends of conductors 20*c* and 20*h* in the first direction than the second ends of conductors 20*c* and 20*h* in the first direction are.

Conductors 20*i* and 20*j* are linearly arranged to be spaced apart from each other in the first direction. The first end side of conductor 20*i* in the first direction is located between conductors 20*f* and 20*k* in the second direction. The first end of conductor 20*i* in the first direction is located more inward than first ends of conductors 20*f* and 20*k* in the first direction. In other words, the first end of conductor 20*i* in the first direction is located closer to the second ends of conductors 20*f* and 20*k* in the first direction than the first ends of conductors 20*f* and 20*k* in the first direction.

The second end side of conductor 20*i* in the first direction is located between conductors 20*g* and 20*l* in the second direction. The second end of conductor 20*i* in the first direction is located closer to the first ends of conductors 20*g* and 20*l* in the first direction than the center portions of conductors 20*g* and 20*l*.

The first end side of conductor 20*j* in the first direction is located between conductors 20*g* and 20*l* in the second direction. The first end of conductor 20*j* in the first direction is located closer to the second ends of conductors 20*g* and 20*l* in the first direction than the center or approximate center portions of conductors 20*g* and 20*l*.

The second end side of conductor 20*j* in the first direction is located between conductors 20*h* and 20*m* in the second direction. The second end of conductor 20*j* in the first direction is located more inward than the second ends of conductors 20*h* and 20*m* in the first direction. In other words, the second end of conductor 20*j* in the first direction is located closer to first ends of conductors 20*h* and 20*m* in the first direction than the second ends of conductors 20*h* and 20*m* in the first direction are.

As shown in FIG. 3, in the second state in which tensile force acts in the first direction to cause elastic conductor 1 to be expanded in the first direction, stretchable base 10 having a low modulus of elasticity extends in the first direction while reducing or preventing deformation of the plurality of conductors 20*a* to 20*m* each having a high modulus of elasticity. Thus, as compared with the first state in which tensile force does not act in the first direction, the distance between the conductors in the first direction is relatively long while the distance between the conductors in the second direction is relatively short.

For example, in first line L1, the distance between conductors 20*a* and 20*b* in the first direction is increased, and the distance between conductors 20*b* and 20*c* in the first direction is increased. Similarly, in third line L3 and fifth line L5, the distance between conductors 20*f* and 20*g* in the first direction is increased, the distance between conductors 20*g* and 20*h* in the first direction is increased, the distance between conductors 20*k* and 20*l* in the first direction is increased, and the distance between conductors 20*l* and 20*m* in the first direction is increased.

On the other hand, first line L1 and second line L2 are moved closer to third line L3 located in the center or approximate center portion of stretchable base 10 in the second direction. Similarly, fourth line L4 and fifth line L5 are moved closer to third line L3 located in the center or approximate center portion of stretchable base 10 in the second direction.

Specifically, the distance between conductors 20*a*, 20*b* and conductor 20*d* in the second direction and the distance between conductors 20*b*, 20*c* and conductor 20*e* in the second direction are shorter than those in the first state. Also, the distance between conductor 20*d* and conductors 20*f*, 20*g* in the second direction, and the distance between conductor 20*e* and conductors 20*g*, 20*h* in the second direction are shorter than those in the first state.

Similarly, the distance between conductors 20*k*, 20*l* and conductor 20*i* in the second direction, and the distance between conductors 20*l*, 20*m* and conductor 20*j* in the second direction are shorter than those in the first state. Also, the distance between conductor 20*i* and conductors 20*f*, 20*g* in the second direction, and the distance between conductor 20*j* and conductors 20*g*, 20*h* in the second direction are shorter than those in the first state.

In this manner, the plurality of conductors 20*a* to 20*m* are moved closer to each other in the second direction, thus providing a conductive path, for example, as shown by a dashed arrow line.

When stretchable base 10 is expanded in the first direction, the width of stretchable base 10 in the second direction is decreased. Thus, in the portion of stretchable base 10 in which its width is decreased, the electrical resistance of stretchable base 10 in the expanding direction is increased. In this case, in elastic conductor 1 according to the present preferred embodiment, the conductive path as described above is provided, thus offsetting the increase in electrical resistance of stretchable base 10 to a significant degree. Accordingly, it becomes possible to reduce or prevent an increase in the overall electrical resistance of elastic conductor 1.

As described above, in elastic conductor 1 according to the present preferred embodiment, it becomes possible to reduce or prevent an increase in electrical resistance caused by an increase in path length when elastic conductor 1 is expanded in a prescribed direction.

FIGS. 4 to 8 show cross-sectional views illustrating the first step to the fifth step, respectively, of a non-limiting example of a method of manufacturing an elastic conductor according to the present preferred embodiment. Referring to FIGS. 4 to 8, the method of manufacturing elastic conductor 1 according to the present preferred embodiment will be hereinafter described.

Figure 4:
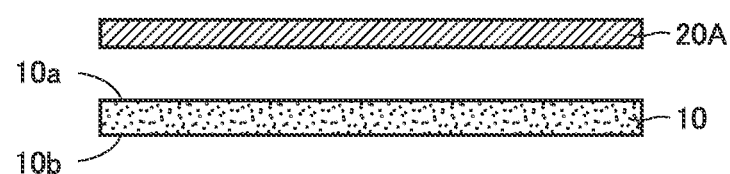
FIG. 4 is a cross-sectional view showing the first step of a method of manufacturing the elastic conductor according to the first preferred embodiment of the present invention.

As shown in FIG. 4, in the first step of the method of manufacturing elastic conductor 1, a stretchable base 10 and a conductor precursor body 20A are prepared. Stretchable base 10 to be used is preferably, for example, obtained by adding a carbon filler to SEBS as described above. Conductor precursor body 20A to be used is preferably, for example, a sheet-shaped copper foil including a roughened main surface 20A1 on one side.

Figure 5:
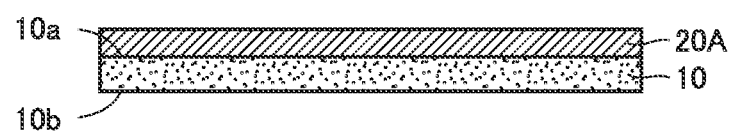
FIG. 5 is a cross-sectional view showing the second step of the method of manufacturing the elastic conductor according to the first preferred embodiment of the present invention.

As shown in FIG. 5, in the second step of the method of manufacturing elastic conductor 1, stretchable base 10 and conductor precursor body 20A are arranged to face each other such that roughened main surface 20A1 faces stretchable base 10. Then, the resultant is subjected to thermocompression-bonding at a temperature of about 120° C. to about 180° C., for example.

Figure 6:
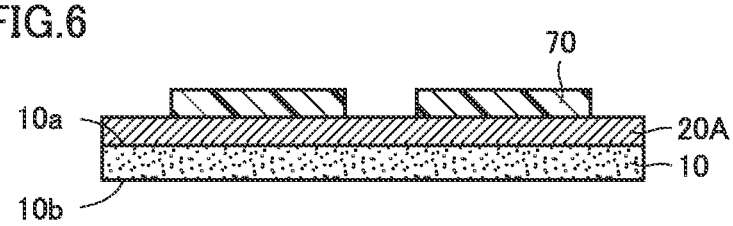
FIG. 6 is a cross-sectional view showing the third step of the method of manufacturing the elastic conductor according to the first preferred embodiment of the present invention.

As shown in FIG. 6, in the third step of the method of manufacturing elastic conductor 1, a photoresist is applied, and then, exposure and development are conducted, thus forming a resist pattern 70. Resist pattern 70 has a shape corresponding to a plurality of conductors.

Figure 7:
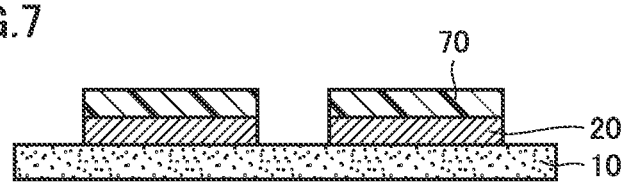
FIG. 7 is a cross-sectional view showing the fourth step of the method of manufacturing the elastic conductor according to the first preferred embodiment of the present invention.

The material, the film thickness, and the formation method of a photoresist may be optional. Also, a positive photoresist may be used or a negative photoresist may be used. As shown in FIG. 7, in the fourth step of the method of manufacturing elastic conductor 1, conductor precursor body 20A is etched using an etching solution to form a plurality of conductors 20a to 20m on a surface 10a of stretchable base 10. The etching solution to be used is preferably a ferric chloride solution, for example.

Figure 8:
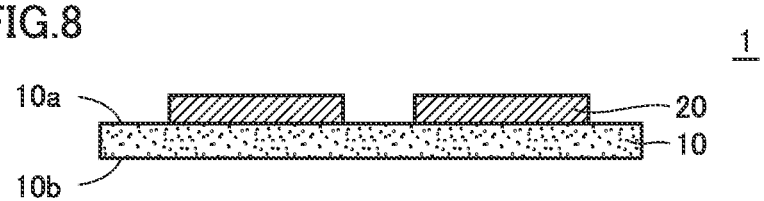
FIG. 8 is a cross-sectional view showing the fifth step of the method of manufacturing the elastic conductor according to the first preferred embodiment of the present invention.

As shown in FIG. 8, in the fifth step of the method of manufacturing elastic conductor 1, resist pattern 70 is removed to produce elastic conductor 1.

Second Preferred Embodiment

Figure 9:
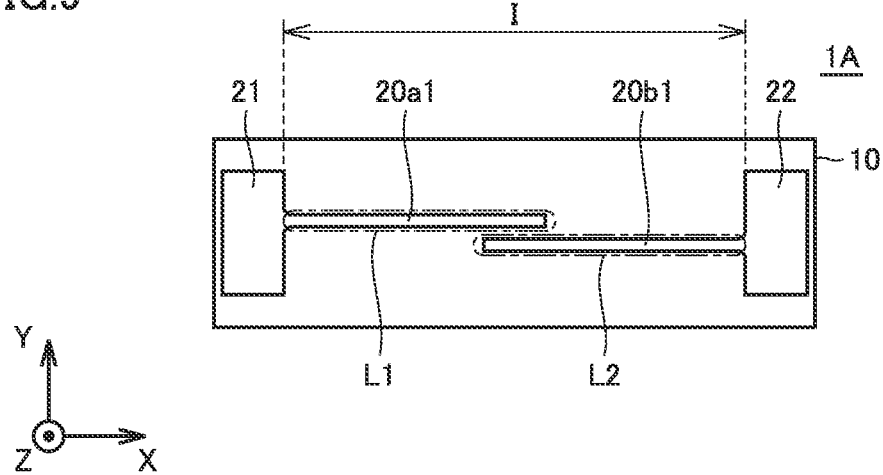
FIG. 9 is a plan view of an elastic conductor according to a second preferred embodiment of the present invention.

FIG. 9 is a plan view of an elastic conductor according to a second preferred embodiment of the present invention. Referring to FIG. 9, an elastic conductor 1A according to the present preferred embodiment will hereinafter be described.

As shown in FIG. 9, elastic conductor 1A according to the present preferred embodiment is different from elastic conductor 1 according to the first preferred embodiment in that pattern shapes of a plurality of conductors and electrode portions 21 and 22 are provided.

The plurality of conductors 20a1 and 20b1 are spaced apart from each other in the second direction perpendicular or substantially perpendicular to the first direction, and to be continuous in at least a partial section I extending in the first direction as seen in the second direction from one end of partial section I to the other end of partial section I in the first direction. At least a partial section I used herein means, for example, a section between electrode portions 21 and 22 provided on the one end side and the other end side, respectively, of stretchable base 10 in the first direction.

One end of conductor 20a1 in the first direction is connected to electrode portion 21 provided on the one end side of stretchable base 10 in the first direction. The second end side of conductor 20a1 in the first direction faces, in the second direction, the first end side of conductor 20b1 in the first direction. The second end of conductor 20a1 in the first direction is located closer to the second end of conductor 20b1 in the first direction than one end of conductor 20b1 in the first direction is.

The first end side of conductor 20b1 in the first direction faces, in the second direction, the second end side of conductor 20a in the first direction. The second end of conductor 20b1 is connected to electrode portion 22 provided on the other end side of stretchable base 10 in the first direction.

Each of electrode portions 21 and 22 preferably has a rectangular or substantially rectangular shape having a short side direction corresponding to the first direction and a long side direction corresponding to the second direction. Electrode portions 21 and 22 are electrically connected to an interconnector and other suitable member.

Also in the configuration as described above, in the second state in which tensile force acts in the first direction to cause elastic conductor 1 to be expanded in the first direction, stretchable base 10 having a low modulus of elasticity extends in the first direction while reducing or preventing deformation of the plurality of conductors 20a1 and 20b1 each having a high modulus of elasticity. Accordingly, the distance between conductors 20a1 and 20b1 in the second direction is shorter than that in the first state in which tensile force does not act in the first direction.

Thus, in the second state, a conductive path passes through conductors 20a1 and 20b1 that are located close to each other as in the first preferred embodiment.

Thus, even if stretchable base 10 is expanded in the first direction and reduced in width in the second direction to increase the electrical resistance of stretchable base 10 in the first direction, the increased electrical resistance of stretchable base 10 is offset to a significant degree due to formation of a conductive path. Thus, it becomes possible to reduce or prevent an increase in the overall electrical resistance of elastic conductor 1. Consequently, also in elastic conductor 1A according to the present preferred embodiment, it becomes possible to reduce or prevent an increase in electrical resistance caused by an increase in path length when this elastic conductor 1A is expanded in a prescribed direction.

Third Preferred Embodiment

Figure 10:
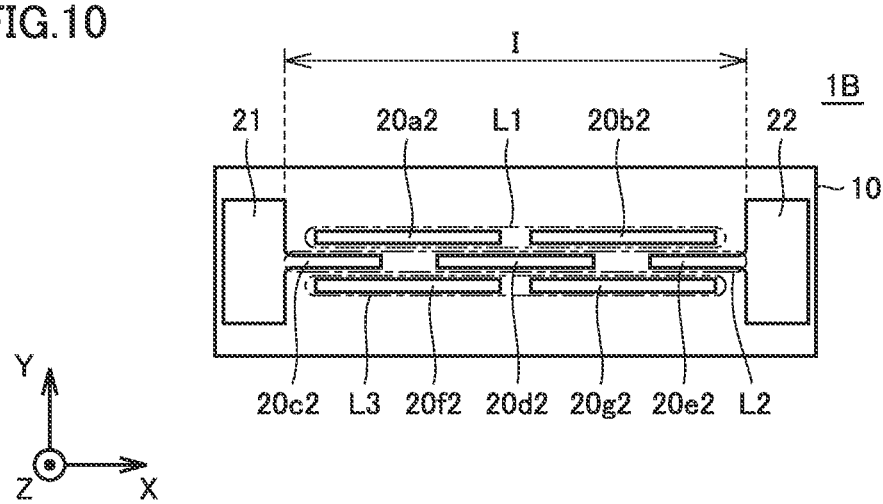
FIG. 10 is a plan view of an elastic conductor according to a third preferred embodiment of the present invention.

FIG. 10 is a plan view of an elastic conductor according to a third preferred embodiment of the present invention. Referring to FIG. 10, an elastic conductor 1B according to the present preferred embodiment will hereinafter be described.

As shown in FIG. 10, elastic conductor 1B according to the present preferred embodiment is different from elastic conductor 1 according to the first preferred embodiment in that pattern shapes of a plurality of conductors and electrode portions 21 and 22 are provided.

A plurality of conductors 20a2 to 20g2 are spaced apart from each other in the second direction perpendicular or substantially perpendicular to the first direction, and to be continuous in at least a partial section I extending in the first direction as seen in the second direction from one end of partial section I to the other end of partial section I in the first direction.

The plurality of conductors 20a2 to 20g2 are arranged in a staggered manner. Some conductors of the plurality of conductors 20a2 to 20g2 are linearly arranged to be spaced apart from each other in the first direction, to define a first line L1 to a third line L3. First line L1 to third line L3 are sequentially arranged side by side to be spaced apart from each other in the Y-axis direction. Second line L2 is located in the center or approximate center portion of stretchable base 10 in the second direction.

First line L1 and third line L3 preferably have the same or substantially the same configuration. First line L1 includes conductors 20a2 and 20b2. Conductors 20a2 and 20b2 are linearly arranged to be spaced apart from each other in the first direction. Third line L3 includes conductors 20f2 and 20g2. Conductors 20f2 and 20g2 are linearly arranged to be spaced apart from each other in the first direction.

Conductors 20a2 and 20f2 are located on the one end side of section I. Conductors 20a2 and 20f2 have almost the same length. First ends of conductors 20a2 and 20f2 in the first direction overlap with each other as seen in the second direction. The second ends of conductors 20a2 and 20f2 in the first direction overlap with each other as seen in the second direction. Conductors 20a2 and 20f2 are arranged side by side to be spaced apart from each other in the second direction.

Conductors 20b2 and 20g2 are located on the one end side of section I. Conductors 20b2 and 20g2 preferably have the same or substantially the same length. First ends of conductors 20b2 and 20g2 in the first direction overlap with each other as seen in the second direction. The second ends of conductors 20b2 and 20g2 in the first direction overlap with each other as seen in the second direction. Conductors 20b2 and 20g2 are arranged side by side to be spaced apart from each other in the second direction.

Second line L2 includes conductors 20c2, 20d2 and 20e2. Conductors 20c2, 20d2 and 20e2 are linearly arranged to be spaced apart from each other in the first direction.

One end of conductor 20c2 in the first direction is connected to electrode portion 21. The second end side of conductor 20c2 in the first direction is located between conductors 20a2 and 20f2 in the second direction. The second end of conductor 20c2 in the first direction is located closer to first ends of conductors 20a2 and 20f2 than the center or approximate center portions of conductors 20a2 and 20f2 are.

The first end side of conductor 20d2 is located between conductors 20a2 and 20f2 in the second direction. One end of conductor 20d2 is located closer to the second ends of conductors 20a2 and 20f2 than the center or approximate center portions of conductors 20a2 and 20f2 are.

The second end side of conductor 20d2 is located between conductors 20b2 and 20g2 in the second direction. The second end of conductor 20d2 is located closer to first ends of conductors 20b2 and one 20g2 in the first direction than the center or approximate center portions of conductors 20b2 and 20g2 are.

The first end side of conductor 20e2 is located between conductors 20b2 and 20g2. One end of conductor 20e2 is located closer to the second ends of conductors 20b2 and 20g2 in the first direction than the center or approximate center portions of conductors 20b2 and 20g2 are. The second end of conductor 20e2 is connected to electrode portion 22.

Also in the configuration as described above, in the second state in which tensile force acts in the first direction to cause elastic conductor 1 to be expanded in the first direction, stretchable base 10 having a low modulus of elasticity extends in the first direction while reducing or preventing deformation of the plurality of conductors 20a2 to 20g2 each having a high modulus of elasticity. Accordingly, as compared to the first state in which tensile force does not act in the first direction, the distance between the conductors in the first direction is increased and the distance between the conductors in the second direction is decreased.

Specifically, in first line L1, the distance between conductors 20a2 and 20b2 in the first direction is increased. In second line L2, the distance between conductors 20c2 and 20d2 in the first direction is increased, and the distance between conductors 20d2 and 20e2 in the first direction is increased. In third line L3, the distance between conductors 20f2 and 20g2 in the first direction is increased.

On the other hand, first line L1 and third line L3 are brought closer to second line L2 located in the center or approximate center portion of stretchable base 10 in the second direction.

Specifically, the distance between conductor 20a2 and conductors 20c2, 20d2 in the second direction is reduced, and the distance between conductor 20b2 and conductors 20d2, 20e2 in the second direction is reduced. Also, the distance between conductors 20c2, 20d2 and conductor 20f2 in the second direction is reduced, and the distance between conductors 20d2, 20e2 and conductor 20g2 in the second direction is reduced.

Thus, a conductive path is provided so as to cause a current to flow through conductors 20c2, 20a2, 20d2, 20b2, and 20e2 that are located in close proximity to each other, and a conductive path is provided so as to cause a current to flow through conductors 20c2, 20f2, 20d2, 20g2, and 20e2 that are located in close proximity to each other.

Thus, even if stretchable base 10 is expanded in the first direction and reduced in width in the second direction to increase the electrical resistance of stretchable base 10 in the first direction, the increased electrical resistance of stretchable base 10 is offset to a significant degree due to formation of a conductive path. Thus, it becomes possible to reduce or prevent an increase in the overall electrical resistance of elastic conductor 1. Consequently, also in elastic conductor 1B according to the present preferred embodiment, it becomes possible to reduce or prevent an increase in electrical resistance caused by an increase in path length when the elastic conductor 1B is expanded in a prescribed direction.

In addition, elastic conductor 1B according to the present preferred embodiment includes a greater number of conductive paths than elastic conductor 1A according to the second preferred embodiment. Thus, it becomes possible to further reduce or prevent an increase in the overall electrical resistance of elastic conductor 1.

Fourth Preferred Embodiment

Figure 11:
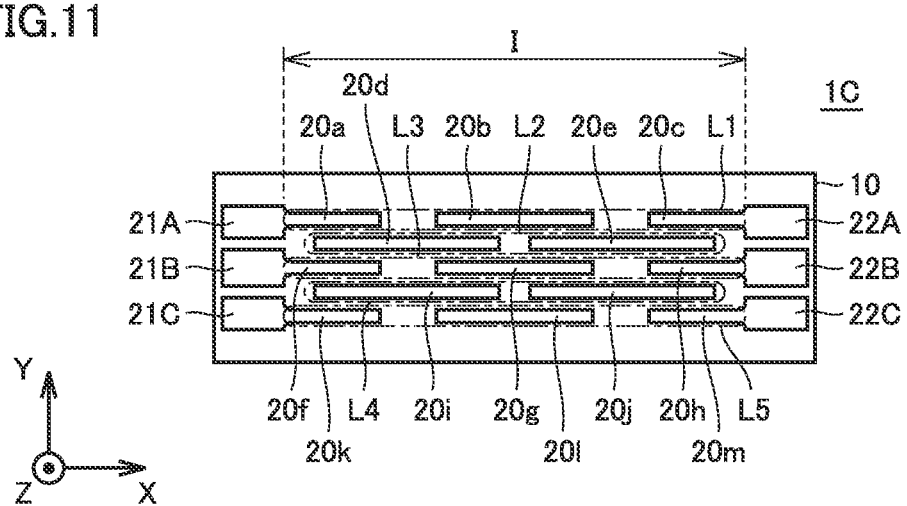
FIG. 11 is a plan view of an elastic conductor according to a fourth preferred embodiment of the present invention.

FIG. 11 is a plan view of an elastic conductor according to a fourth preferred embodiment of the present invention. Referring to FIG. 11, an elastic conductor 1C according to the present preferred embodiment will hereinafter be described.

As shown in FIG. 11, elastic conductor 1C according to the present preferred embodiment is different from elastic conductor 1 according to the first preferred embodiment in that electrode portions 21A to 21C and 22A to 22C are provided.

Electrode portions 21A, 21B and 21C are spaced apart from each other in the second direction. Electrode portions 22A, 22B and 22C are spaced apart from each other in the second direction.

Any of electrode portions 21A, 21B and 21C may be electrically connected to an interconnection member and other suitable member. Any of electrode portions 22A, 22B and 22C may be electrically connected to an interconnection member and other suitable member.

In this manner, electrode portions 21A to 21C are spaced apart from each other in the second direction, and electrode portions 22A to 22C are spaced apart from each other in the second direction. Thus, when stretchable base 10 is expanded in the first direction, electrode portions 21A to 21C may be brought closer to each other and electrode portions 22A to 22C may be brought closer to each other.

In the case in which electrode portions 21A to 21C are not spaced apart from each other but defined as an integral electrode portion and electrode portions 22A to 22C are not spaced apart from each other but defined as an integral electrode portion, contraction of stretchable base 10 in the second direction is reduced or prevented in the vicinity of each of the integral electrode portions when stretchable base 10 is expanded in the first direction. Thus, the first end side of conductor 20a in the first direction and the second end side of conductor 20c in the first direction are less likely to be closer to conductor 20f and conductor 20h, respectively.

In this case, in the present preferred embodiment, electrode portions 21A to 21C are brought closer to each other, and electrode portions 22A to 22C are brought closer to each other. Thus, conductor 20a connected to electrode portion 21A is able to be entirely moved toward conductor 20f and conductor 20c connected to electrode portion 22A is able to be entirely moved toward conductor 20h.

Furthermore, conductor 20k connected to electrode portion 21C is able to be entirely moved toward conductor 20i and conductor 20m connected to electrode portion 22C is able to be entirely moved toward conductor 20j.

Thus, in the second state in which stretchable base 10 is expanded in the first direction, the above-described conductive path are reliably provided. Due to formation of a conductive path, even if stretchable base 10 is expanded in the first direction and reduced in width in the second direction to increase the electrical resistance of stretchable base 10 in the first direction, the increased electrical resistance of stretchable base 10 is offset to a significant degree. Thus, it becomes possible to reduce or prevent an increase in the overall electrical resistance of elastic conductor 1. Consequently, also in elastic conductor 1C according to the present preferred embodiment, it becomes possible to reduce or prevent an increase in electrical resistance caused by an increase in path length when this elastic conductor 1C is expanded in a prescribed direction.

In addition, elastic conductor 1C according to the present preferred embodiment has a greater number of lines in the second direction than elastic conductor 1B according to the third preferred embodiment. Thus, the number of conductive paths provided in the second state increases. Therefore, in elastic conductor 1C according to the present preferred embodiment, it becomes possible to more effectively reduce or prevent an increase in the overall electrical resistance of elastic conductor 1 than in elastic conductor 1B according to the third preferred embodiment.

Fifth Preferred Embodiment

Figure 12:
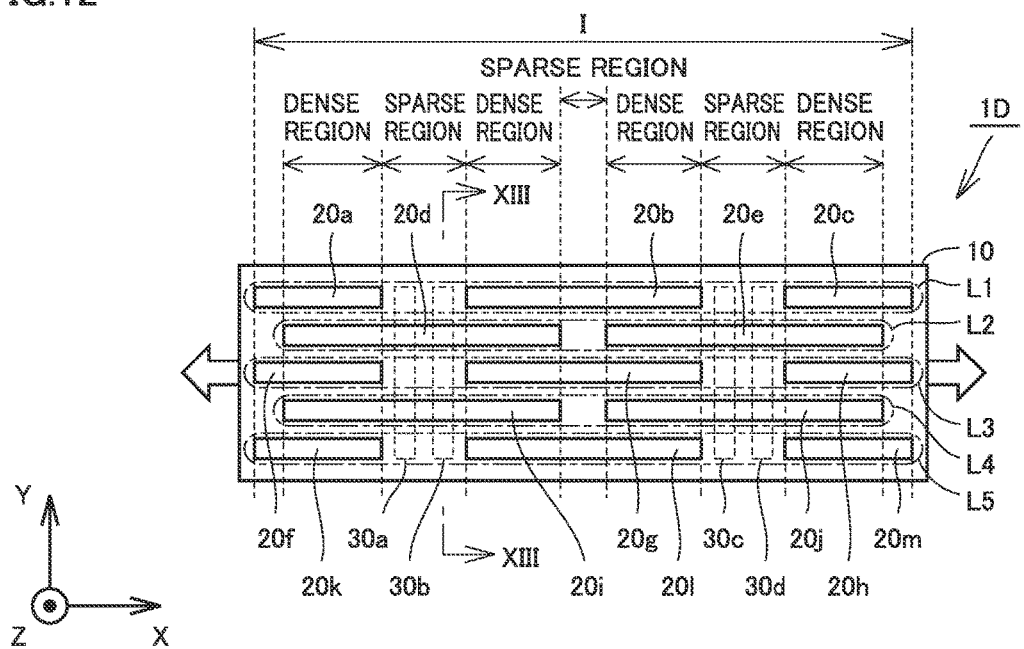
FIG. 12 is a plan view of an elastic conductor according to a fifth preferred embodiment of the present invention.
Figure 13:
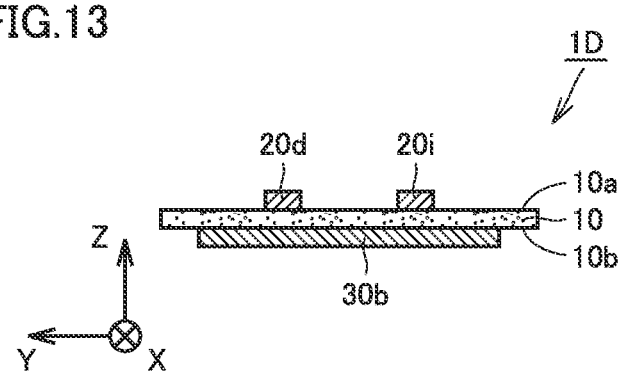
FIG. 13 is a cross-sectional view taken along a line XIII-XIII shown in FIG. 12.
Figure 14:
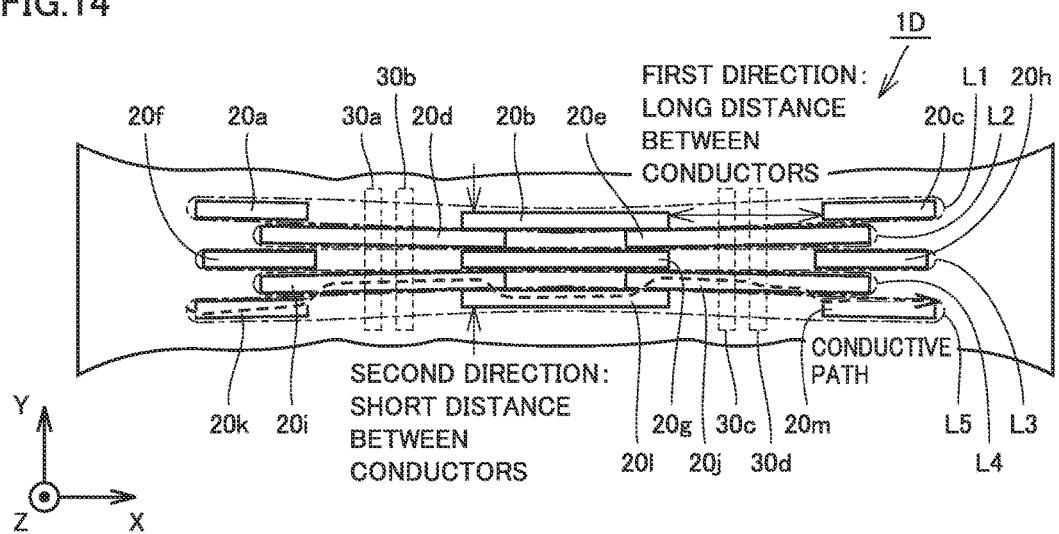
FIG. 14 is a diagram showing a state in which the elastic conductor according to the fifth preferred embodiment of the present invention is tensioned in the first direction.

FIG. 12 is a plan view of an elastic conductor according to a fifth preferred embodiment of the present invention. FIG. 13 is a cross-sectional view taken along a line XIII-XIII shown in FIG. 12. FIG. 14 is a diagram showing the state in which the elastic conductor according to the present preferred embodiment is tensioned in the first direction. Referring to FIGS. 12 to 14, an elastic conductor 1D according to the present preferred embodiment will hereinafter be described.

As shown in FIGS. 12 to 14, elastic conductor 1D according to the present preferred embodiment is different from elastic conductor 1 according to the first preferred embodiment in that restraint members 30a to 30d are provided.

In section I in which a plurality of conductors 20a to 20m are provided, some conductors of the plurality of conductors 20a to 20m are arranged side by side in the second direction, to provide a dense region in which the conductors along the width of stretchable base 10 in the second direction are dense in number, and a sparse region in which the conductors along the width of stretchable base 10 in the second direction are less dense in number than in the dense region.

Restraint members 30a to 30d are provided on a back surface 10b of stretchable base 10 on the opposite side of a surface 10a of stretchable base 10 on which the plurality of conductors 20a to 20m are provided.

Restraint members 30a to 30d have a higher modulus of elasticity than stretchable base 10, and are structured to reduce or prevent expansion and contraction of stretchable base 10 in the second direction. Each of restraint members 30a to 30d includes a portion extending in the second direction. Each of restraint members 30a to 30d preferably has a longitudinal shape extending in the second direction, for example. In addition, the shape of each of restraint members 30a to 30d is not limited to a longitudinal shape, but may be modified as appropriate.

Restraint members 30a to 30d are provided on the back surface 10b of stretchable base 10 so as to overlap with the above-mentioned sparse region as seen in the direction perpendicular or substantially perpendicular to surface 10a of stretchable base 10. Each of restraint members 30a to 30d is preferably made of metal foil, for example. Restraint members 30a to 30d each may be made of the same material as those of conductors 20a to 20m, or may be made of a material different from those of conductors 20a to 20m. Furthermore, each of restraint members 30a to 30d is not required to be a conductor, and may be made of a highly elastic resin material, such as polyimide, for example.

By providing restraint members 30a to 30d, expansion of the width of stretchable base 10 in the second direction is reduced or prevented even if stretchable base 10 is expanded in the second direction due to force exerted from an unintended direction when stretchable base 10 is expanded in the first direction.

As described above, also in the present preferred embodiment, in the second state in which tensile force acts in the first direction to cause elastic conductor 1D to be expanded in the first direction, the distance between the conductors in the second direction is shorter than that in the first state, thus providing a conductive path. Accordingly, the increase in electrical resistance of stretchable base 10 occurring in the second state is offset to a significant degree. Thus, it becomes possible to reduce or prevent an increase in the overall electric resistance of elastic conductor 1D. Consequently, it becomes possible to reduce or prevent an increase in electrical resistance caused by an increase in path length when this elastic conductor is expanded in a prescribed direction.

In addition, due the restraint members 30a to 30d, as described above, even if stretchable base 10 is expanded in the second direction by the force exerted from the unintended direction when stretchable base 10 is expanded in the first direction, expansion of the width of stretchable base 10 in the second direction is reduced or prevented.

An elastic conductor 1E according to the present preferred embodiment may be manufactured as follows. Specifically, metal foil as a conductor precursor body and metal foil as a restraint member precursor body are thermocompression-bonded onto surface 10a and back surface 10b of stretchable base 10, and then, the conductor precursor body and the restraint member precursor body are patterned using the photolithography method as in the first preferred embodiment.

When the conductor precursor body and the restraint member precursor body are patterned, a through hole is formed in a stretchable substrate with both surfaces on which metal foils are compression-bonded such that the through hole penetrates through the substrate in its thickness direction from the metal foil on one side to the metal foil on the other side. Then, patterning is conducted using this through hole as an alignment mark, so that a conductor and a restraint member are able to be formed with accuracy.

In addition, the conductor precursor body, the restraint member precursor body and stretchable base 10 including through holes penetrating therethrough in their thickness directions at the same position may be prepared. In this case, for example, in order to allow communication between the through holes provided in the conductor precursor body, the restraint member precursor body and stretchable base 10, specifically, by using each through hole as a positioning mark, the conductor precursor body, the restraint member precursor body, and stretchable base 10 are stacked on one another and thermocompression-bonded. Thus, the conductor precursor body and the restraint member precursor body are able to be accurately fixed to stretchable base 10 while preventing positional misalignment between the conductor precursor body and the restraint member precursor body. In addition, a positioning pin may be inserted through each through hole as required for fixation.

This also enables accurate patterning of the conductor precursor body and the restraint member precursor body, so that a plurality of conductors 20a to 20m and restraint members 30a to 30d are able to be formed with accuracy.

Sixth Preferred Embodiment

Figure 15:
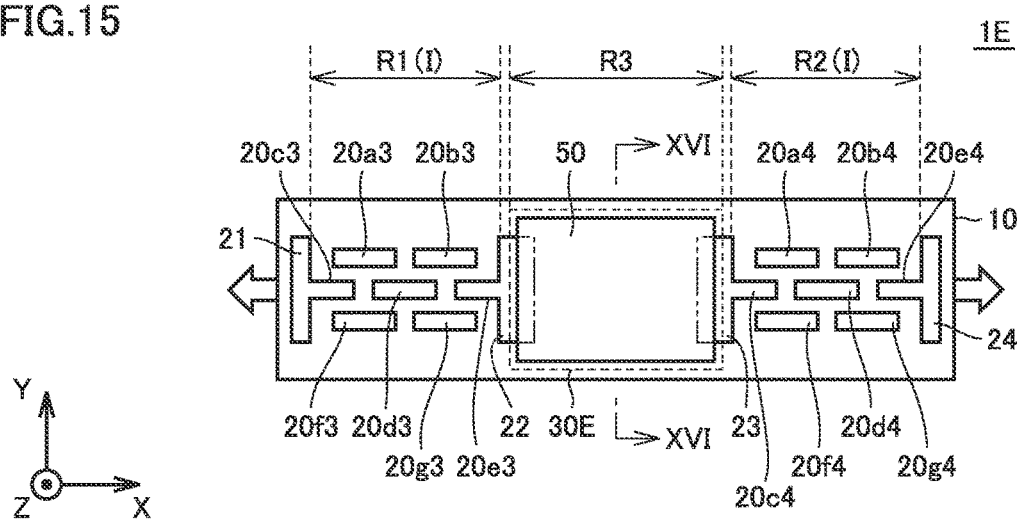
FIG. 15 is a plan view of an elastic conductor according to a sixth preferred embodiment of the present invention.
Figure 16:
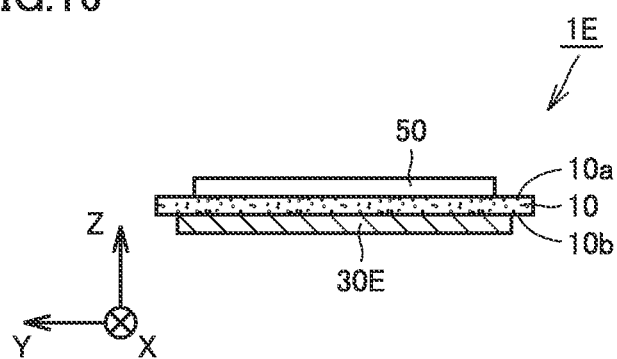
FIG. 16 is a cross-sectional view taken along a line XVI-XVI shown in FIG. 15.
Figure 17:
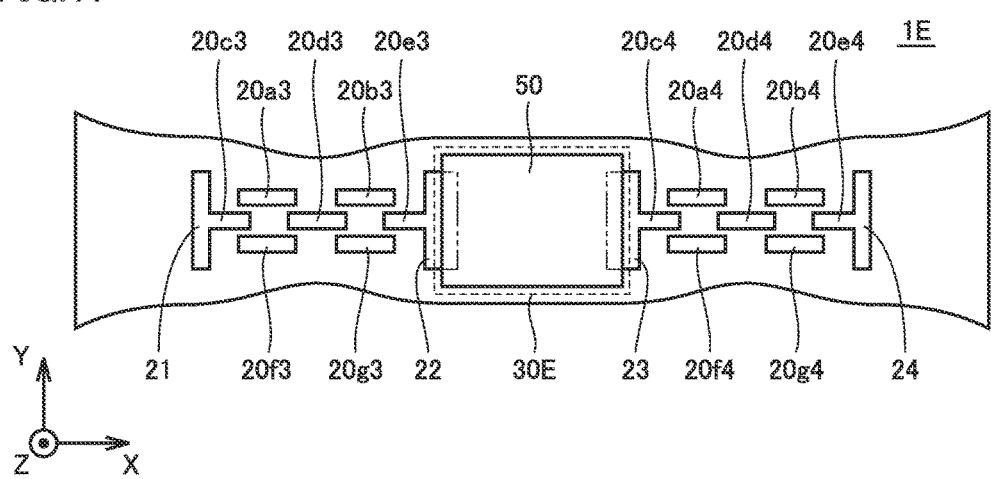
FIG. 17 is a diagram showing a state in which the elastic conductor according to the sixth preferred embodiment of the present invention is tensioned in the first direction.

FIG. 15 is a plan view of an elastic conductor according to a sixth preferred embodiment of the present invention. FIG. 15 is a diagram showing a state before the elastic conductor is tensioned in the first direction. FIG. 16 is a cross-sectional view taken along a line XVI-XVI shown in FIG. 15. FIG. 17 is a diagram showing a state in which the elastic conductor according to the present preferred embodiment is tensioned in the first direction. Referring to FIGS. 15 to 17, elastic conductor 1E according to the present preferred embodiment will be hereinafter described.

As shown in FIGS. 15 to 17, elastic conductor 1E according to the present preferred embodiment is different from elastic conductor 1 according to the first preferred embodiment in that a circuit substrate 50 as an electronic component is provided on the surface of stretchable base 10, and in that a restraint member 30E is provided on the back surface of stretchable base 10 corresponding to the surface on which circuit substrate 50 is provided. Circuit substrate 50 is illustrated as an electronic component, though not limited thereto. Alternatively, surface-mounted components, such as a capacitor and a chip coil, elements having bumps, such as an IC, and other suitable components may also be used.

A plurality of conductors are provided in a first region R1 and a second region R2. Each of first region R1 and second region R2 defines at least a partial section I in stretchable base 10 extending in the first direction. First region R1 and second region R2 are spaced apart from each other in the first direction. An electronic component mounted region R3 on which an electronic component is mounted is provided on the surface of stretchable base 10 located between first region R1 and second region R2.

A plurality of conductors 20a3 to 20g3 are provided in first region R1. The plurality of conductors 20a3 to 20g3 are arranged in a layout similar to that of the plurality of conductors 20a2 to 20g2 according to the third preferred embodiment.

One end of conductor 20c3 in the first direction is connected to electrode portion 21. The second end of conductor 20e3 in the first direction is connected to electrode portion 22.

A plurality of conductors 20a4 to 20g4 are provided in second region R2. The plurality of conductors 20a4 to 20g4 are arranged in a layout similar to that of the plurality of conductors 20a2 to 20g2 according to the third preferred embodiment.

One end of conductor 20c4 in the first direction is connected to electrode portion 23. The second end of conductor 20e4 in the first direction is connected to electrode portion 24.

Circuit substrate 50 includes terminal portions at both ends in the first direction. The terminal portions of circuit substrate 50 are connected to electrode portion 22 and electrode portion 23 with solder or other suitable conductive adhesive. The region between one end of electrode portion 22 in the first direction and the other end of electrode portion 23 in the first direction corresponds to electronic component mounted region R3.

Restraint member 30E is provided on back surface 10b of stretchable base 10 so as to overlap with electronic component mounted region R3 as seen in the direction perpendicular or substantially perpendicular to surface 10a of stretchable base 10. Restraint member 30E has a higher modulus of elasticity than stretchable base 10, and is structured to reduce or prevent expansion and contraction of stretchable base 10 in the second direction.

Restraint member 30E preferably has a rectangular or substantially rectangular shape, for example. In addition, the shape of restraint member 30E is not limited to a rectangular or substantially rectangular shape as long as it is able to reduce or prevent expansion and contraction of stretchable base 10 in the second direction, but may be a polygonal shape, a circular shape, a frame shape, a lattice shape, and other suitable shapes.

Restraint member 30E may be made of the same material as the plurality of conductors 20a3 to 20g3 and 20a4 to 20g4, or may be made of different materials. Furthermore, restraint member 30E is not required to be a conductor, and may be made of a highly elastic resin material, such as polyimide, an epoxy resin and other suitable resin material, for example. When restraint member 30E is made of a highly elastic resin material, an adhesive may be used to achieve adhesive contact between the stretchable base and the restraint member.

By providing restraint member 30E in this manner, as shown in FIG. 17, when stretchable base 10 is expanded in the first direction, expansion and contraction of stretchable base 10 in the second direction in a portion corresponding to electronic component mounted region R3 is reduced or prevented while bringing the plurality of conductors 20a3 to 20g3 closer to each other in the second direction in first region R1 and bringing the plurality of conductors 20a4 to 20g4 closer to each other in the second direction in second region R2. In addition, restraint member 30E reduces or prevents expansion and contraction of stretchable base 10 not only in the second direction but also in any direction.

As described above, also in the present preferred embodiment, in the second state in which tensile force acts in the first direction to cause elastic conductor 1 to be expanded in the first direction, the distance between the conductors in the second direction is shorter than that in the first state, thus providing a conductive path. Therefore, the increase in electrical resistance of stretchable base 10 occurring in the second state is offset to a significant degree. Accordingly, it becomes possible to reduce or prevent an increase in the overall electrical resistance of elastic conductor 1. Consequently, it becomes possible to reduce or prevent an increase in electrical resistance caused by an increase in path length when elastic conductor 1 is expanded in a prescribed direction.

Furthermore, expansion and contraction of the width of stretchable base 10 in the second direction in a portion corresponding to electronic component mounted region R3 are reduced or prevented, so that it becomes possible to reduce or prevent separation of circuit substrate 50 from the surface of stretchable base 10.

Elastic conductor 1E according to the present preferred embodiment may be manufactured based on the method of manufacturing elastic conductor 1D according to the fifth preferred embodiment. Circuit substrate 50 is fixed to electrode portions 22 and 23 with solder or other conductive adhesive after the plurality of conductors and restraint member 30E are formed.

Elastic conductor 1E according to the present preferred embodiment has been described with reference to a case in which first region R1, second region R2, and electronic component mounted region R3 are provided, but is not limited thereto, and may be a configuration in which first region R1 and electronic component mounted region R3 are provided but second region R2 is not provided. In this case, it is preferable that electronic component mounted region R3 is provided so as to be adjacent to first region R1. Such a configuration also achieves the effects similar to that described above.

Also, the present preferred embodiment has been described with reference to a case in which restraint member 30E is provided on back surface 10b of stretchable base 10 so as to overlap with electronic component mounted region R3 as seen in the direction perpendicular or substantially perpendicular to surface 10a of stretchable base 10, but is not limited thereto, and may be provided inside stretchable base 10.

Seventh Preferred Embodiment

Figure 18:
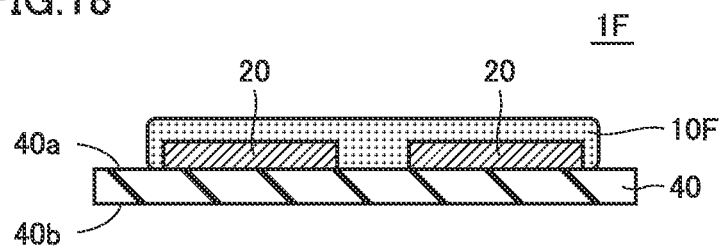
FIG. 18 is a cross-sectional view of an elastic conductor according to a seventh preferred embodiment of the present invention.

FIG. 18 is a plan view of an elastic conductor according to a seventh preferred embodiment of the present invention. Referring to FIG. 18, an elastic conductor 1F according to the present preferred embodiment will hereinafter be described.

As shown in FIG. 18, elastic conductor 1F according to the present preferred embodiment is different from elastic conductor 1 according to the first preferred embodiment in that it includes a plurality of conductors 20, a stretchable base 10F having conductivity and an elastic base 40 supporting these members, and also in that the plurality of conductors 20 are provided inside stretchable base 10F.

Elastic base 40 preferably has a plate shape, for example. Elastic base 40 includes a first main surface 40a and a second main surface 40b that face in opposite directions. Elastic base 40 is structured so as to be stretchable. Elastic base 40 is preferably made of, for example, thermoplastic elastomer such as SEBS.

The plurality of conductors 20 are provided on first main surface 40a of elastic base 40. The plurality of conductors 20 preferably have the same or substantially the same configuration as that in the first preferred embodiment, for example. The plurality of conductors 20 have a higher modulus of elasticity than elastic base 40 and stretchable base 10F. The plurality of conductors 20 each are preferably, for example, made of a single-phase metal foil made of Cu, Ag, Au, Ni, Zn, Al, Sn and other suitable material, or made of metal foil made of an alloy including at least some of these metals.

The material of the metal foil is not particularly limited, but preferably has a specific resistance equal to or less than about $10^{-5}$ Ω•m, for example. It is preferable that the material of the metal foil is metal primarily including Cu in view of versatility, cost, and other factors. For the purpose of preventing oxidation, the surfaces of the plurality of conductors 20 may be subjected to surface treatment, such as NiAu plating or NiPdAu plating, for example.

For example, the plurality of conductors 20 may be formed by a subtractive method, or may be formed by an additive method using plating growth, or by a method of transferring pre-patterned metal foil.

Stretchable base 10F is provided on first main surface 40a of elastic base 40 so as to cover the plurality of conductors 20. Stretchable base 10F has conductivity and is structured so as to be stretchable. Stretchable base 10F only needs to be a stretchable conductor, and may be made using a material obtained by kneading a conductive polymer or resin represented by polyacetylene, polyphenylene, polyphenylene vinylene, polypyrrole, polythiophene, polyethylene dioxythiophene (PEDOT), polyaniline, polyacene, graphene, and other suitable conductive polymer or resin with a one-dimensional conductor represented by an Ag nanowire and a carbon nanotube, conductive rubber obtained by kneading thermoplastic elastomer with carbon or metal filler; and other suitable materials. Stretchable base 10F may be made of a material obtained by kneading a stretchable resin material with particulate or flat-shaped metal filler. Metal filler may be Ag, Cu, Al, Ni, Sn, Zn, or an alloy made of two or more of these metals.

Also in the configuration as described above, in the second state in which tensile force acts in the first direction to cause elastic conductor 1F to be expanded in the first direction, the distance between the conductors in the second direction is shorter than that in the first state, so that a conductive path is provided. Due to formation of a conductive path, the increase in electrical resistance of stretchable base 10 occurring in the second state is offset to a significant degree. Thus, it becomes possible to reduce or prevent an increase in the overall electrical resistance of elastic conductor 1. Consequently, elastic conductor 1F according to the present preferred embodiment is able to reduce or prevent an increase in electrical resistance caused by an increase in path length when this elastic conductor 1F is expanded in a prescribed direction.

FIGS. 19 to 24 are diagrams showing the first step to the sixth step, respectively, of an example of a non-limiting method of manufacturing an elastic conductor according to the present preferred embodiment. Referring to FIGS. 19 to 24, the method of manufacturing an elastic conductor according to the present preferred embodiment will be hereinafter described.

Figure 19:
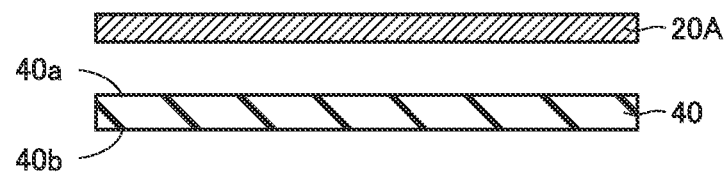
FIG. 19 is a diagram showing the first step of a method of manufacturing the elastic conductor according to the seventh preferred embodiment of the present invention.

As shown in FIG. 19, in the first step of the method of manufacturing elastic conductor 1F, an elastic base 40 and a conductor precursor body 20A are prepared. Elastic base 40 to be used is a seat-shaped SEBS. Conductor precursor body 20A is preferably, for example, a sheet-shaped copper foil including a roughened main surface 20A1 on one side.

Figure 20:
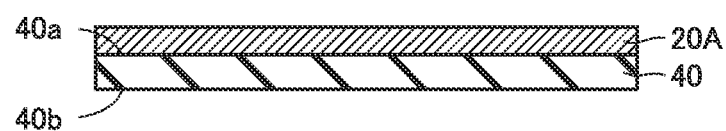
FIG. 20 is a diagram showing the second step of the method of manufacturing the elastic conductor according to the seventh preferred embodiment of the present invention.

As shown in FIG. 20, in the second step of the method of manufacturing elastic conductor 1F, elastic base 40 and conductor precursor body 20A are arranged to face each other such that roughened main surface 20A1 faces elastic base 40, which are then thermocompression-bonded at a temperature of about 120° C. to about 180° C., for example.

Figure 21:
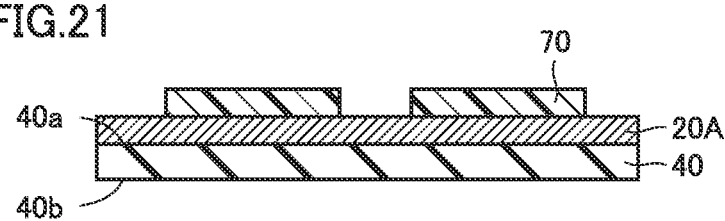
FIG. 21 is a diagram showing the third step of the method of manufacturing the elastic conductor according to the seventh preferred embodiment of the present invention.

As shown in FIG. 21, in the third step of the method of manufacturing elastic conductor 1F, a photoresist is applied, and then, exposure and development are conducted, thus forming a resist pattern 70. Resist pattern 70 has a shape corresponding to a plurality of conductors.

The material, the film thickness, and the formation method of a photoresist may be optional. Also, a positive photoresist may be used or a negative photoresist may be used.

Figure 22:
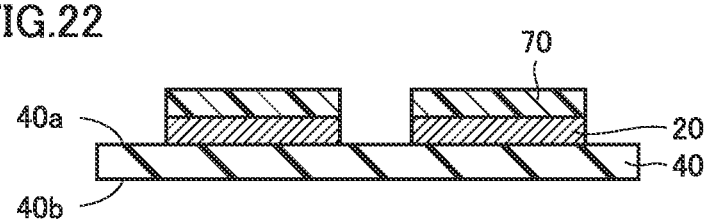
FIG. 22 is a diagram showing the fourth step of the method of manufacturing the elastic conductor according to the seventh preferred embodiment of the present invention.

As shown in FIG. 22, in the fourth step of the method of manufacturing elastic conductor 1F, conductor precursor body 20A is etched using an etching solution to form a plurality of conductors 20a to 20m on a first main surface 40a of elastic base 40. The etching solution to be used may preferably be a ferric chloride solution, for example.

Figure 23:
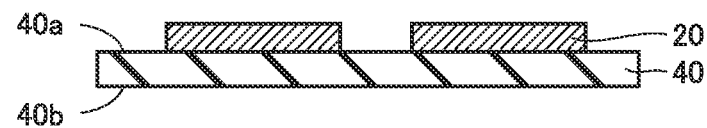
FIG. 23 is a diagram showing the fifth step of the method of manufacturing the elastic conductor according to the seventh preferred embodiment of the present invention.

As shown in FIG. 23, in the fifth step of the method of manufacturing elastic conductor 1, resist pattern 70 is removed to produce a plurality of conductors 20.

Figure 24:
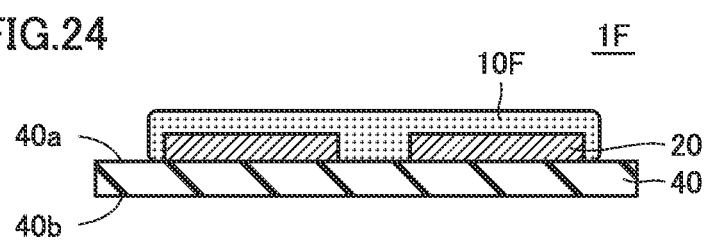
FIG. 24 is a diagram showing the sixth step of the method of manufacturing the elastic conductor according to the seventh preferred embodiment of the present invention.

As shown in FIG. 24, in the sixth step of the method of manufacturing elastic conductor 1F, a conductive paste primarily made of Ag filler is applied over first main surface 40a of elastic base 40 so as to cover the plurality of conductors 20. Then, the applied conductive paste is dried in the environment at a temperature of about 80° C. to about 150° C., for example, to form stretchable base 10F having stretchability. Thus, elastic conductor 1F is manufactured.

In addition, an elastic conductor corresponding to each of the elastic conductors according to the first to sixth preferred embodiments may be manufactured based on the method of manufacturing elastic conductor 1F according to the present preferred embodiment. The elastic conductor corresponding to each of the elastic conductors according to the first to sixth preferred embodiments is obtained by forming, on an elastic base, pattern shapes identical or substantially identical to those of the plurality of conductors according to each of the first to sixth preferred embodiments, and then covering the formed pattern shapes with a stretchable base.

For example, the elastic conductor corresponding to the fifth preferred embodiment includes a restraint member that has a higher modulus of elasticity than elastic base 40 and significantly reduces or prevents expansion and contraction of elastic base 40 in the second direction. In at least a partial section I corresponding to the fifth preferred embodiment, some conductors of the plurality of conductors are arranged side by side in the second direction to define a dense region in which the conductors along the width of the stretchable base in the second direction are dense in number, and a sparse region in which the conductors along the width of the stretchable base in the second direction are less dense in number than in the dense region. The restraint member is provided on the second main surface so as to overlap with the sparse region as seen in the direction perpendicular or substantially perpendicular to second main surface 40a of elastic base 40.

Furthermore, the elastic conductor corresponding to the sixth preferred embodiment includes a restraint member having a higher modulus of elasticity than elastic base 40 and reduces or prevents expansion of elastic base 40 in the second direction. On the surface of the stretchable base adjacent to at least a partial section I corresponding to the sixth preferred embodiment, an electronic component mounted region including an electronic component mounted thereon is provided. The restraint member is provided on the second main surface or inside elastic base 40 so as to overlap with the electronic component mounted region as seen in the direction perpendicular or substantially perpendicular to the second main surface.

Figure 25:
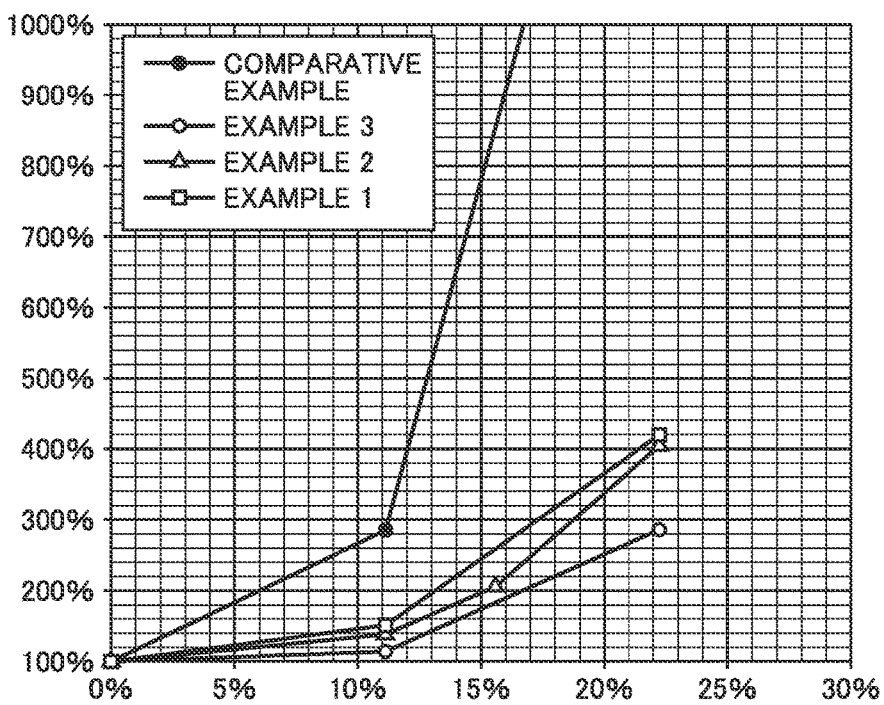
FIG. 25 is a diagram showing conditions and results of a verification experiment performed to verify the effects of preferred embodiments of the present invention.

FIG. 25 is a diagram showing conditions and results of a verification experiment performed to verify the effects of preferred embodiments of the present invention. Referring to FIG. 25, the conditions and results of the verification experiment performed to verify the effects of preferred embodiments of the present invention will be hereinafter described. In FIG. 25, the vertical axis shows the resistance of the elastic conductor and the horizontal axis shows expansion of the elastic conductor in the first direction.

As shown in FIG. 25, to verify the effects of preferred embodiments of the present invention, an elastic conductor in Comparative Example 1 and elastic conductors according to Examples 1 to 3 were prepared. An elastic conductor used in Comparative Example 1 was an elastic conductor not provided with a plurality of conductors, but including electrode portions provided on both ends of a stretchable base having stretchability. As an elastic conductor according to Example 1, the elastic conductor according to the second preferred embodiment was used. As an elastic conductor according to Example 2, the elastic conductor according to the third preferred embodiment was used. As an elastic conductor according to Example 3, the elastic conductor according to the fourth preferred embodiment was used. As described above, the number of conductive paths provided in the second state is increased sequentially in order of Example 1, Example 2, and Example 3 so as to correspond to the second preferred embodiment, the third preferred embodiment, and the fourth preferred embodiment.

Then, the resistance changes were measured, which occurred when the elastic conductor in Comparative Example 1 and the elastic conductors according to Examples 1 to 3 were expanded in the first direction. In this case, the electrical resistances of the elastic conductor according to Comparative Example 1 and the elastic conductors according to Examples 1 to 3 in the first state were set to be the same value.

In Comparative Example 1, the electrical resistance increased as the elastic conductor was expanded in the first direction. Then, in the state in which the elastic conductor was expanded by about 11%, the electrical resistance reached a value that was about 2.8 times as high as the value in the first state. When the elastic conductor was expanded over about 11%, the electrical resistance abruptly increased.

In Examples 1 to 3, the electrical resistance increased as the elastic conductor was expanded in the first direction, but the increased amount was reduced as compared to that in Comparative Example 1.

Example 1 showed a value that was about 1.5 times as high as that in the first state in the state in which the elastic conductor was expanded by about 11%. Also, when the elastic conductor was expanded over about 11%, the increase rate of the electrical resistance was increased, but was significantly reduced as compared to that in Comparative Example 1.

Example 2 showed a value that was about 1.4 times as high as that in the first state in the state in which the elastic conductor was expanded by about 11%. Also, when the elastic conductor was expanded over about 11%, the increase rate of the electrical resistance was increased, but was significantly reduced as compared to that in Comparative Example 1.

Example 3 showed a value that was about 1.2 times as high as that in the first state in the state in which the elastic conductor was expanded by about 11%. Also, when the elastic conductor was expanded over about 11%, the increase rate of the electrical resistance was increased, but was significantly reduced as compared to that in Comparative Example 1.

Based on the above-described results, it was experimentally confirmed that an increase in electrical resistance caused by expansion of the elastic conductor in the first direction is reduced or prevented by the following configuration. Specifically, a plurality of conductors are arranged on a stretchable base so as to be spaced apart from each other in the second direction perpendicular or substantially perpendicular to the first direction, and to be continuous in at least a partial section extending in the first direction as seen in the second direction from one end of the partial section to the other end of the partial section in the first direction, in which the distance between the conductors adjacent to each other in the second direction in the second state is shorter than the distance between the conductors adjacent to each other in the second direction in the first state.

In the elastic conductors according to Examples 1 to 3, the conductive paths provided when tension is applied in the first direction are different in number, in which the number of the conductive paths is increased sequentially in order of Example 1, Example 2, and Example 3. The increase rate of the electrical resistance decreases sequentially in order of Example 1, Example 2, and Example 3. Thus, it was also experimentally confirmed that the increase in the electrical resistance occurring upon expansion in the first direction is further reduced or prevented as the number of conductive paths increases.

Figure 26:
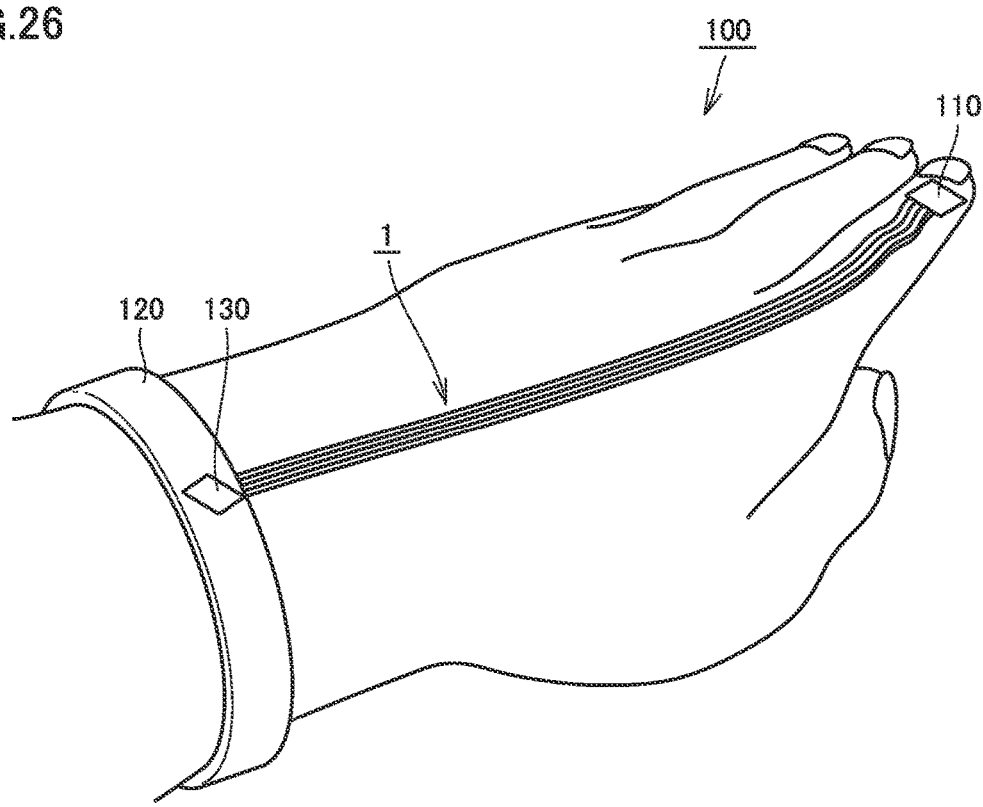
FIG. 26 is a diagram showing the first state of the first use example of an elastic conductor according to a preferred embodiment of the present invention.
Figure 27:
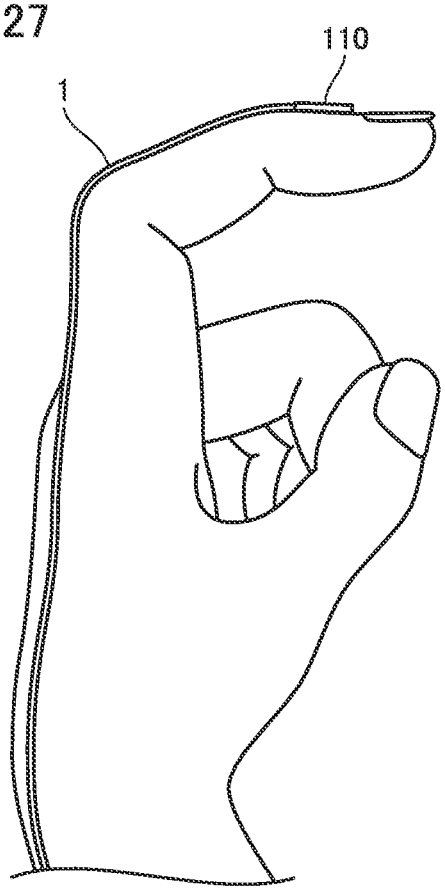
FIG. 27 is a diagram showing the second state of the first use example of an elastic conductor according to a preferred embodiment of the present invention.

FIGS. 26 and 27 are diagrams showing the first state and the second state, respectively, of the first use example of the elastic conductor according to a preferred embodiment of the present invention.

As shown in FIGS. 26 and 27, an elastic conductor 1 according to a preferred embodiment of the present invention connects a sensor unit 110 provided at a user's fingertip and a control substrate 130 fixed to a wristband 120 wound around a user's wrist. The sensing result sensed by sensor unit 110 is input through elastic conductor 1 into a control unit provided in control substrate 130.

Sensor unit 110 is provided, for example, to be capable of sensing a body temperature and other characteristics. As shown in FIG. 26, in the state in which the fingertip is extended, the tensile force in the first direction does not act on elastic conductor 1. As shown in FIG. 27, in the state in which the finger along which elastic conductor 1 is attached is bent, the tensile force in the first direction acts on the bent portion. Thus, elastic conductor 1 is expanded in the first direction.

In such a case, the distance between the conductors in the second direction is shorter than that in the first state, thus providing a conductive path. Therefore, the increase in electrical resistance caused by an increase in path length is reduced or prevented. Accordingly, when the body temperature is sensed by sensor unit 110 as described above, the body temperature is able to be sensed with stability.

Figure 28:
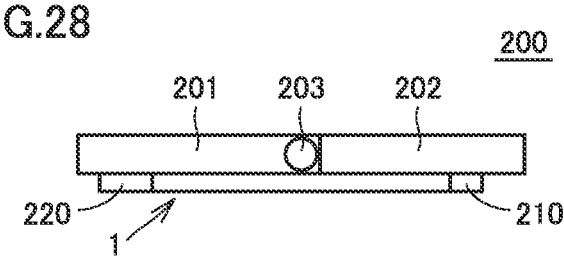
FIG. 28 is a diagram showing the first state of the second use example of an elastic conductor according to a preferred embodiment of the present invention.
Figure 29:
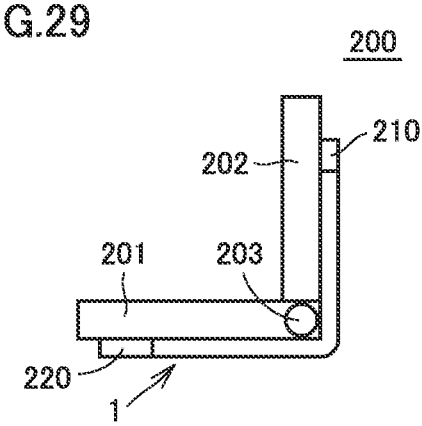
FIG. 29 is a diagram showing the second state of the second use example of an elastic conductor according to a preferred embodiment of the present invention.

FIGS. 28 and 29 are diagrams showing the first state and the second state, respectively, of the second use example of an elastic conductor according to a preferred embodiment of the present invention.

As shown in FIGS. 28 and 29, an elastic conductor 1 according to a preferred embodiment of the present invention connects a sensor unit 210 provided on the tip end side of a movable arm unit 202 and a control substrate 220 provided on a fixed arm unit 201. The sensing result sensed by sensor unit 210 is input through elastic conductor 1 into a control unit provided in control substrate 220.

Movable arm unit 202 is fixed to fixed arm unit 201 by a hinge mechanism 203. Movable arm unit 202 is pivotable about the pivot axis extending in the direction perpendicular or substantially perpendicular to the plane of the sheet of paper showing FIGS. 28 and 29.

Sensor unit 210 is provided, for example, to be capable of sensing a temperature, humidity and other characteristics. As shown in FIG. 28, when movable arm unit 202 and fixed arm unit 201 are linearly arranged, elastic conductor 1 does not undergo tensile force in the first direction. As shown in FIG. 29, when movable arm unit 202 pivots about the pivot axis, the tensile force acts in the first direction corresponding to the direction in which elastic conductor 1 extends. Thus, elastic conductor 1 is expanded in the first direction.

In such a case, the distance between the conductors in the second direction is shorter than that in the first state, thus providing a conductive path. Accordingly, the increase in electrical resistance caused by an increase in path length is reduced or prevented. Therefore, when sensor unit 210 senses a temperature, humidity and other characteristics as described above, the temperature and humidity and other characteristics are able to be sensed with stability.

The elastic conductors according to the above preferred embodiments have been described with reference to a case in which the conductor is preferably made of metal foil, for example, although not limited thereto. Alternatively, the conductor may be made of a metal material in a bulk state. In this case, the metal material in a bulk state means a massive metal material made of hardened metal, but does not include a metal material formed by drying a binder including a large amount of metal particles, such as a paste material, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic conductor comprising:
   a stretchable base having conductivity; and
   a plurality of conductors each having a longitudinal shape extending in a first direction and arranged on a surface of the stretchable base or inside the stretchable base, each of the plurality of conductors having a lower specific resistance and a higher modulus of elasticity than the stretchable base; wherein
   the elastic conductor is changeable between a first state before a tensile force acts in the first direction and a second state in which the tensile force acts in the first direction to cause the elastic conductor to be expanded in the first direction;
   in the first state, the plurality of conductors are spaced apart from each other in a second direction perpendicular or substantially perpendicular to the first direction, and are continuous in at least a partial section extending in the first direction as seen in the second direction from one end of the partial section to another end of the partial section in the first direction; and
   a distance between conductors of the plurality of conductors adjacent to each other in the second direction in the second state is shorter than a distance between the conductors adjacent to each other in the second direction in the first state.

2. The elastic conductor according to claim 1, wherein each of the plurality of conductors is made of a metal material in a bulk state or a metal foil.

3. The elastic conductor according to claim 1, further comprising:
   a restraint member having a higher modulus of elasticity than the stretchable base, the restraint member being structured to reduce or prevent expansion and contraction of the stretchable base in the second direction; wherein
   in the at least a partial section, two or more conductors of the plurality of conductors are arranged side by side in the second direction, to define:
      a dense region in which the plurality of conductors along a width of the stretchable base in the second direction are dense in number; and a sparse region in which the plurality of conductors along the width of the stretchable base in the second direction are less dense in number than in the dense region; and the restraint member is provided on a back surface of the stretchable base so as to overlap with the sparse region as seen in a direction perpendicular or substantially perpendicular to the surface of the stretchable base.

4. The elastic conductor according to claim 1, further comprising:

a restraint member having a higher modulus of elasticity than the stretchable base, the restraint member being structured to reduce or prevent expansion and contraction of the stretchable base in the second direction; wherein an electronic component mounted region including an electronic component mounted thereon is provided on the surface of the stretchable base, the surface being adjacent to the at least a partial section; and the restraint member is provided on a back surface of the stretchable base or inside the stretchable base so as to overlap with the electronic component mounted region as seen in a direction perpendicular or substantially perpendicular to the surface of the stretchable base.

5. The elastic conductor according to claim 1, further comprising:

an elastic base including a first main surface and a second main surface that face in opposite directions, the elastic base being structured to support the stretchable base and the plurality of conductors; wherein the plurality of conductors are provided on the first main surface; and the stretchable base is provided on the first main surface to cover the plurality of conductors.

6. The elastic conductor according to claim 5, further comprising:

a restraint member having a higher modulus of elasticity than the elastic base, the restraint member being structured to reduce or prevent expansion and contraction of the elastic base in the second direction; wherein in the at least a partial section, two or more conductors of the plurality of conductors are arranged side by side in the second direction, to define:

a dense region in which the plurality of conductors along a width of the stretchable base in the second direction are dense in number; and a sparse region in which the plurality of conductors along the width of the stretchable base in the second direction are less dense in number than in the dense region; and the restraint member is provided on the second main surface so as to overlap with the sparse region as seen in a direction perpendicular or substantially perpendicular to the second main surface.

7. The elastic conductor according to claim 5, further comprising:

a restraint member having a higher modulus of elasticity than the elastic base, the restraint member being structured to reduce or prevent expansion of the elastic base in the second direction; wherein an electronic component mounted region including an electronic component mounted thereon is provided on the surface of the stretchable base, the surface being adjacent to the at least a partial section; and the restraint member is provided so as to overlap with the electronic component mounted region as seen in a direction perpendicular or substantially perpendicular to the second main surface.

8. The elastic conductor according to claim 1, wherein the stretchable base has a rectangular or substantially rectangular shape.

9. The elastic conductor according to claim 1, wherein the stretchable base is made of a material including a rubber material or a resin kneaded with conductive powder.

10. The elastic conductor according to claim 1, wherein the conductive powder is a metal selected from the group consisting of Ag, Cu, Al, Zn, Ni, and Sn, or an alloy including two or more of the metals.

11. The elastic conductor according to claim 1, wherein the stretchable base is made of a material including a thermoplastic elastomer kneaded with carbon filler.

12. The elastic conductor according to claim 1, wherein each of the plurality of conductors is made of a copper foil.

13. The elastic conductor according to claim 1, wherein the plurality of conductors are arranged in a staggered manner.

14. The elastic conductor according to claim 1, wherein some conductors of the plurality of conductors are linearly arranged so as to be spaced apart from each other in the first direction.

15. The elastic conductor according to claim 1, wherein the plurality of conductors are arranged in a plurality of lines sequentially arranged so as to be spaced apart from each other in second direction.

16. The elastic conductor according to claim 15, wherein the plurality of lines consists of five lines.

17. The elastic conductor according to claim 15, wherein the plurality of lines consists of three lines.

18. The elastic conductor according to claim 1, wherein
one end of a conductor of the plurality of the conductors in the first direction is connected to an electrode portion provided on a first end side of stretchable base in the first direction; and one end of another conductor of the plurality of the conductors in the first direction is connected to another electrode portion provided on a second end side of stretchable base in the first direction opposite to the first end side.

19. The elastic conductor according to claim 18, wherein each of the electrode portion and the another electrode portion has a rectangular or substantially rectangular shape with a short side direction corresponding to the first direction and a long side direction corresponding to the second direction.

* * * * *